United States Patent
Wu et al.

(10) Patent No.: US 9,064,814 B2
(45) Date of Patent: Jun. 23, 2015

(54) SEMICONDUCTOR STRUCTURE HAVING METAL GATE AND MANUFACTURING METHOD THEREOF

(71) Applicant: UNITED MICROELECTRONICS CORP., Hsin-Chu (TW)

(72) Inventors: Yi-Ching Wu, Kaohsiung (TW); Chih-Sen Huang, Tainan (TW); Ching-Wen Hung, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 79 days.

(21) Appl. No.: 13/921,221

(22) Filed: Jun. 19, 2013

(65) Prior Publication Data

US 2014/0374805 A1     Dec. 25, 2014

(51) Int. Cl.
    *H01L 27/092*      (2006.01)
    *H01L 21/311*      (2006.01)
    *H01L 23/485*      (2006.01)
    *H01L 21/8238*     (2006.01)

(52) U.S. Cl.
    CPC ............ *H01L 21/311* (2013.01); *H01L 23/485* (2013.01); *H01L 21/823842* (2013.01)

(58) Field of Classification Search
CPC ................... H01L 29/6656; H01L 21/823437; H01L 21/82345; H01L 21/823468; H01L 21/82385; H01L 21/76829; H01L 29/4908; H01L 29/66621; H01L 29/42312; H01L 29/4232; H01L 29/49
USPC .......................................... 257/369, 371, 412
See application file for complete search history.

(56) References Cited

U.S. PATENT DOCUMENTS

| | | | |
|---|---|---|---|
| 5,892,282 A | 4/1999 | Hong |
| 5,998,873 A | 12/1999 | Blair |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,573,134 B2 | 6/2003 | Ma |
| 6,855,607 B2 | 2/2005 | Achuthan |
| 6,960,416 B2 | 11/2005 | Mui |
| 7,013,446 B2 | 3/2006 | Ohba |
| 7,112,495 B2 | 9/2006 | Ko |
| 7,126,199 B2 | 10/2006 | Doczy |
| 7,144,783 B2 | 12/2006 | Datta |
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,214,620 B2 | 5/2007 | Kim |
| 7,217,611 B2 | 5/2007 | Kavalieros |
| 7,250,658 B2 | 7/2007 | Doris |
| 7,355,281 B2 | 4/2008 | Brask |
| 7,407,876 B2 | 8/2008 | Ishizaka |
| 7,521,324 B2 | 4/2009 | Ohmi |

(Continued)

*Primary Examiner* — Minh-Loan Tran
(74) *Attorney, Agent, or Firm* — Winston Hsu; Scott Margo (57) ABSTRACT

A manufacturing method for a semiconductor device first provides a substrate having at least a first transistor formed thereon. The first transistor includes a first conductivity type. The first transistor further includes a first metal gate and a protecting layer covering sidewalls of the first metal gate. A portion of the first metal gate is removed to form a first recess and followed by removing a portion of the protecting layer to form a second recess. Then, an etch stop layer is formed in the second recess.

7 Claims, 7 Drawing Sheets

(56) References Cited

U.S. PATENT DOCUMENTS

| Patent/Publication | Date | Name |
|---|---|---|
| 7,531,437 B2 | 5/2009 | Brask |
| 7,556,998 B2 | 7/2009 | Park |
| 7,592,270 B2 | 9/2009 | Teo |
| 7,666,746 B2 | 2/2010 | Gambino |
| 7,700,479 B2 | 4/2010 | Huang |
| 7,768,074 B2 | 8/2010 | Golonzka |
| 7,816,218 B2 | 10/2010 | Klaus |
| 7,867,863 B2 | 1/2011 | Chang |
| 8,035,165 B2 | 10/2011 | Yeh |
| 8,048,790 B2 | 11/2011 | Soss |
| 8,093,120 B2 | 1/2012 | Yeh |
| 8,120,114 B2 | 2/2012 | Ott |
| 8,202,776 B2 | 6/2012 | Chang |
| 8,222,136 B2 | 7/2012 | Tu |
| 8,232,148 B2 | 7/2012 | Li |
| 8,298,894 B2 * | 10/2012 | Lenski et al. ............. 438/275 |
| 2006/0024953 A1 | 2/2006 | Papa Rao |
| 2007/0015365 A1 | 1/2007 | Chen |
| 2007/0072376 A1 | 3/2007 | Chen |
| 2007/0141798 A1 | 6/2007 | Bohr |
| 2007/0145591 A1 | 6/2007 | Yano |
| 2007/0218661 A1 | 9/2007 | Shroff |
| 2007/0259519 A1 | 11/2007 | Yang |
| 2007/0262451 A1 | 11/2007 | Rachmady |
| 2007/0272123 A1 | 11/2007 | Kennedy |
| 2008/0061366 A1 | 3/2008 | Liu |
| 2008/0076216 A1 | 3/2008 | Pae |
| 2008/0224235 A1 | 9/2008 | Lavoie |
| 2009/0057759 A1 | 3/2009 | Obradovic |
| 2009/0057769 A1 | 3/2009 | Wei |
| 2009/0124097 A1 | 5/2009 | Cheng |
| 2009/0186458 A1 | 7/2009 | Yu |
| 2009/0200494 A1 | 8/2009 | Hatem |
| 2010/0040768 A1 | 2/2010 | Dhindsa |
| 2010/0044783 A1 | 2/2010 | Chuang |
| 2010/0048027 A1 | 2/2010 | Cheng |
| 2010/0065926 A1 | 3/2010 | Yeh |
| 2010/0068877 A1 | 3/2010 | Yeh |
| 2010/0087055 A1 | 4/2010 | Lai |
| 2010/0124818 A1 | 5/2010 | Lee |
| 2010/0129994 A1 | 5/2010 | Awad |
| 2010/0244141 A1 | 9/2010 | Beyer |
| 2010/0283152 A1 | 11/2010 | Chen |
| 2011/0037105 A1 | 2/2011 | Chang |
| 2011/0079827 A1 | 4/2011 | Ellis-Monaghan |
| 2011/0210403 A1 | 9/2011 | Teo |
| 2012/0032238 A1 | 2/2012 | Teo |
| 2012/0034773 A1 | 2/2012 | Ott |
| 2012/0068234 A1 | 3/2012 | Soss |
| 2012/0139015 A1 | 6/2012 | Yu |
| 2012/0139049 A1 | 6/2012 | Kanike |
| 2012/0139061 A1 | 6/2012 | Ramachandran |
| 2012/0153405 A1 | 6/2012 | Heinrich |
| 2012/0187420 A1 | 7/2012 | Li |
| 2012/0187459 A1 | 7/2012 | Pan |
| 2012/0223394 A1 | 9/2012 | Toh |
| 2012/0228679 A1 | 9/2012 | Chang |
| 2013/0288471 A1 * | 10/2013 | Chi .............................. 438/586 |

* cited by examiner

SEMICONDUCTOR STRUCTURE HAVING METAL GATE AND MANUFACTURING METHOD THEREOF

BACKGROUND OF THE INVENTION

1. Field of the Invention

The invention relates to a semiconductor device and a manufacturing method thereof, and more particularly, to a semiconductor device having a metal gate and contact plugs integrated therewith, and a manufacturing method thereof.

2. Description of the Prior Art

In the integrated circuit (IC), electrical connection between different semiconductor devices are constructed by contact structures such as contact plugs and interconnection structures. However, along with the miniaturization of the IC, reduction of the feature size, and progress in fabrication of semiconductor device, the line width of interconnections and the feature size of semiconductor devices have been continuously shrunk. With this trend, any misalignment occurs at contact plugs fabrication process may cause contact plug shift issue and even cause short circuit within a device or between devices. In one circumstance that a gate structure and a source/drain of one device are electrically connected due to contact plug shift, a short circuit occurs within the device and thus the device is failed. In another circumstance that the short circuit occurs at different devices, the whole IC may be failed.

Therefore, a semiconductor device and a manufacturing method thereof that is able to prevent device failure due to contact plug shift issue are still in need.

SUMMARY OF THE INVENTION

To solve the issues mentioned above, the present invention provides a manufacturing method for a semiconductor device. The manufacturing method first provides a substrate having at least a first transistor of a first conductivity type formed thereon. The first transistor includes a first metal gate and a protecting layer covering sidewalls of the first metal gate. Next, a portion of the first metal gate is removed to form a first recess exposing a portion of the protecting layer and followed by removing a portion of the protecting layer exposed by the first recess to form a second recess. Then, an etch stop layer is formed in the second recess.

The present invention further provides a semiconductor device. The semiconductor device includes a substrate, a transistor formed on the substrate, and an etch stop layer. The transistor includes a metal gate and the etch stop layer is formed on a top of the metal gate. A width of the etch stop layer is larger than a width of the metal gate.

According to the semiconductor device and the manufacturing method thereof, the etch stop layer is formed on the metal gate. More important, the width of the etch stop layer is larger than the width of the metal gate. Therefore the metal gate is protected from being exposed in following process such as contact hole etch process. Consequently, short circuit between the metal gate and the source/drain caused by contact plug misalign or contact plug shift is avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-2 and 5-10, which are schematic drawings illustrating a manufacturing method for a semiconductor device provided by a preferred embodiment of the present invention, wherein

FIGS. 3-4 are schematic drawings illustrating a manufacturing method for a semiconductor device provided by another preferred embodiment of the present invention, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

Although the method is illustrated and described as a series of acts or events, it will be appreciated that the present invention is not limited by the illustrate ordering of such acts or events.

Figure 1:
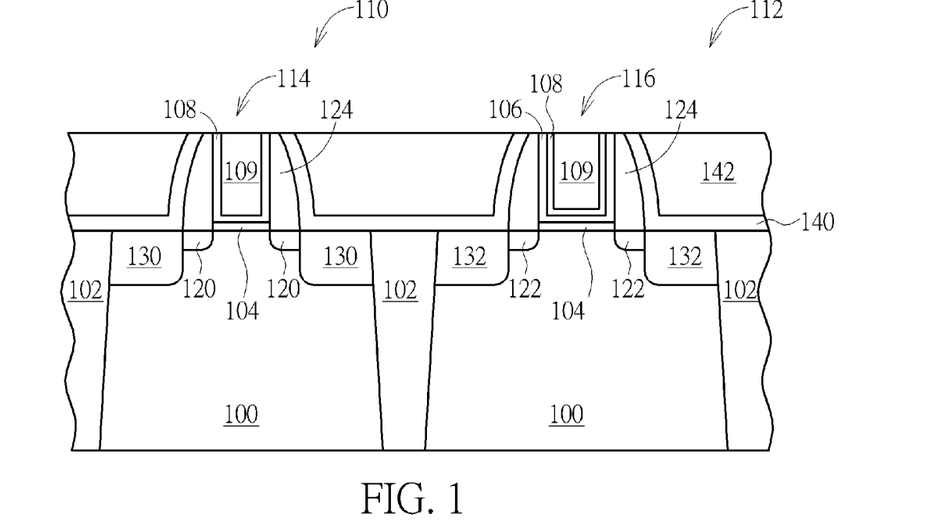

Please refer to FIGS. 1-2 and 5-10, which are schematic drawings illustrating a manufacturing method for a semiconductor device provided by a preferred embodiment of the present invention. As shown in FIG. 1, the preferred embodiment first provides a substrate 100 such as a silicon substrate, a silicon-containing substrate, or a silicon-on-insulator (SOI) substrate. A first transistor 110 and a second transistor 112 are formed on the substrate 100 and electrically isolated by a shallow trench isolation (STI) 102 formed in the substrate 100. The first transistor 110 includes a first conductivity type, the second transistor 112 includes a second conductivity type, and the first conductivity type and the second conductivity type are complementary to each other. In the preferred embodiment, the first transistor 110 is an n-type transistor and the second transistor 112 is a p-type transistor.

Please still refer to FIG. 1. The first transistor 110 and the second transistor 112 respectively include a gate dielectric layer 104, a dummy gate such as a polysilicon layer (not shown), and a hard mask layer for defining placement and size of the dummy gate. The first transistor 110 and the second transistor 112 further respectively include first light doped drains (hereinafter abbreviated as LDDs) 120, second LDDs 122, a spacer 124, and a first source/drain 130, a second source/drain 132. Salicides (not shown) can be formed on the first source/drain 130 and the second source/drain 132. Additionally, the salicides can be formed after forming contact holes when the post contact salicide process is adopted. On the first transistor 110 and the second transistor 112, a contact etch stop layer (hereinafter abbreviated as CESL) 140 and an inter-layer dielectric (hereinafter abbreviated as ILD) layer 142 are sequentially formed. As shown in FIG. 1, the ILD layer 142 surrounds the first transistor 110 and the second transistor 112. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form epitaxial first source/drain 130 and epitaxial second source/drain 132.

Please still refer to FIG. 1. After forming the CESL 140 and the ILD layer 142, a planarization process is performed to remove a portion of the CESL 140 and a portion of the ILD layer 142 to expose the hard mask layer or the dummy gates of the first transistor 110 and the second transistor 112. Subsequently, a suitable etching process is performed to remove the hard mask layer and the dummy gates of the first transistor 110 and the second transistor 112, and thus a first gate trench (not shown) is formed in the first transistor 110 and a second gate trench (not shown) is formed in the second transistor 112, simultaneously. And the dielectric layer 104 is exposed in bottoms of both of the first and the second gate trench. It is noteworthy that the preferred embodiment is integrated with high-k first process, therefore the dielectric layer 104 includes high dielectric constant (high-k) materials such as rare earth metal oxide. The high-k gate dielectric layer 104 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). However, those skilled in the art would easily realize the preferred embodiment can be integrated with high-k last process.

Please still refer to FIG. 1. After forming the first gate trench and the second gate trench, a first work function metal layer 106 is formed in first gate trench and the second gate trench and followed by removing a portion of the first work function metal layer 106 from the first gate trench. In the preferred embodiment, the first work function metal layer 106 is a p-metal layer with a work function between 4.8 and 5.2. Next, a second work function metal layer 108 is formed in the first gate trench and the second gate trench. In the preferred embodiment, the second work function metal layer 108 is an n-metal layer with a work function between 3.9 and 4.3. Then, the first gate trench and the second gate trench are filled with a filling metal layer 109 and followed by performing a planarization process to remove superfluous metal layers. Consequently, a first metal gate 114 is formed in the first transistor 110 and a second metal gate 116 is formed in the second transistor 112. In addition, those skilled in the art would easily realize that other layers such as barrier layer, etch stop layer, or, even strained layer can be formed in the gate trenches before forming the work function metal layers.

Figure 2:
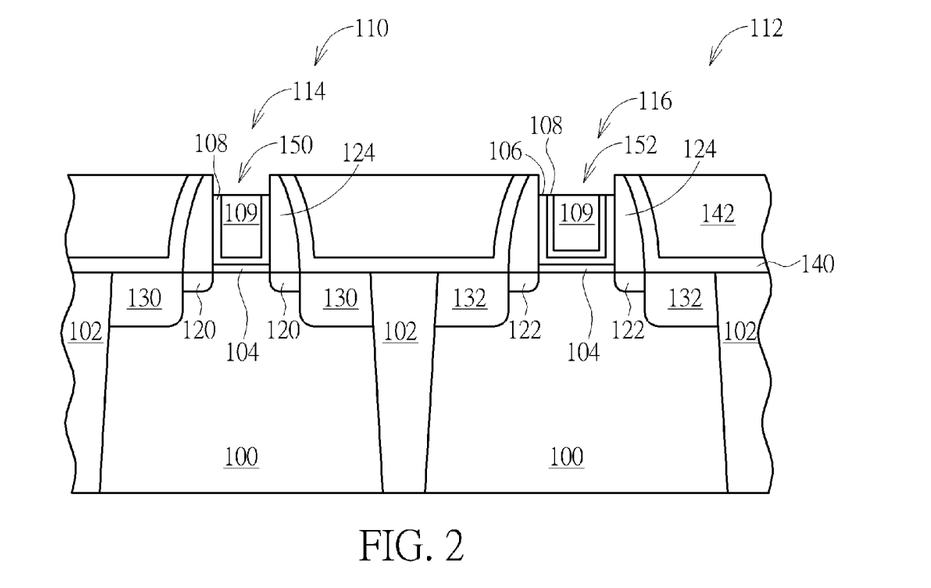
FIG. 2 is a schematic drawing in a step subsequent to FIG. 1.

Please refer to FIG. 2. In the preferred embodiment, the first metal gate 114 and the second metal gate 116 are etched by a suitable metal etch process. Consequently, a first recess 150 is formed in the first metal gate 114 and a third recess 152 is formed in the second metal gate 116, respectively. A depth of the first recess 150 and the third recess 152 is between 250 Å and 400 Å, but not limited to this. It should be noted that sidewalls of the first metal gate 114 and the second metal gate 116 contact the spacer 124. Therefore, the spacer 124 covering sidewalls of the first metal gate 114 and the second metal gate 116 are taken as a protecting layer of the first metal gate 114 and the second metal gate 116. As shown in FIG. 2, the protecting layer (that is the spacer 124), the filling metal layer 109, and the second work function metal layer 108 are exposed in the first recess 150. Also as shown in FIG. 2, the protecting layer (that is the spacer 124), the filling metal layer 109, the second work function metal layer 108, and the first work function metal layer 106 are exposed in the third recess 152.

Figure 3:
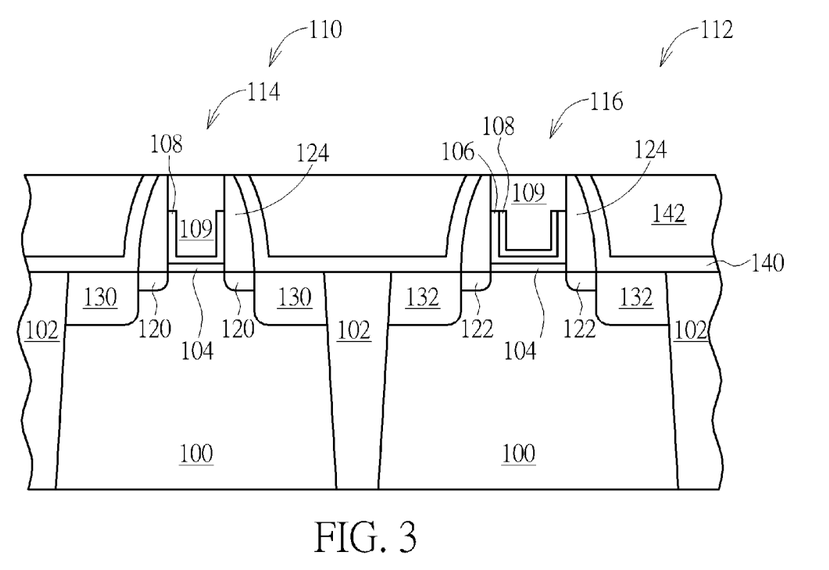
Figure 4:
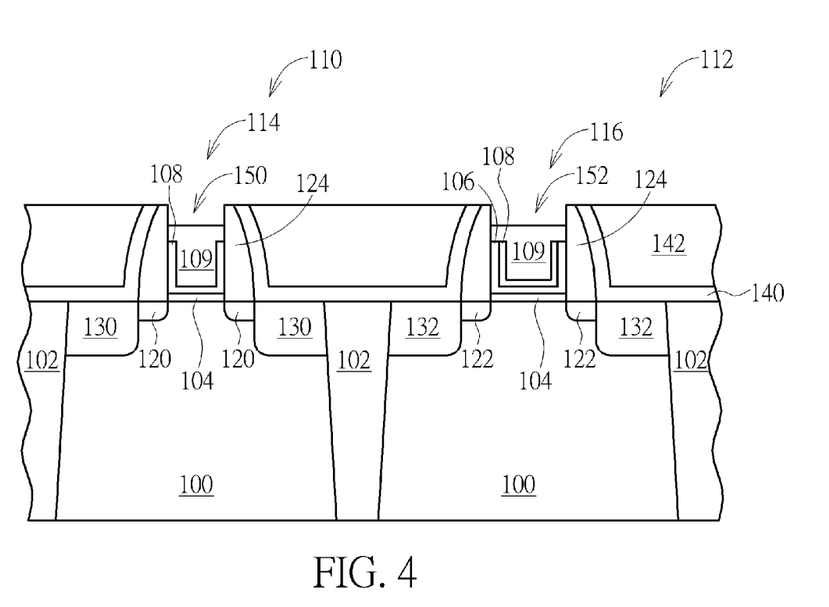
FIG. 4 is a schematic drawing in a step subsequent to FIG. 3.

Please refer to FIGS. 3-4, which are schematic drawings illustrating a manufacturing method for a semiconductor device provided by another preferred embodiment of the present invention. It is noteworthy that elements the same in both of the instant preferred embodiment and the aforementioned preferred embodiment are designated by the same numerals. The same elements can include identical materials and conductivity types, and thus those details are omitted hereinafter in the interest of brevity. The difference between the instant preferred embodiment and the aforementioned preferred embodiment is: Because other metal films may be formed in the gate trenches before forming the work function metals, and each layer formed in the gate trenches reduces an opening width of the gate trenches and makes it difficult to fill the gate trench with the work function metal layer. It even merges to form a seam in the gate trenches and makes it impossible to fill the gate trenches with the filling metal as desired. Therefore, a portion of the first work function metal layer 106 and the second work function metal layer 108 are respectively removed from the opening the gate trenches according to the preferred embodiment. Consequently, layers formed after the first work function metal layer 106 and the second work function metal layer 108 are formed without seam and adverse impact to the semiconductor device is prevented. Accordingly, the first work function metal layer 106 and the second work function metal layer 108 in the first metal gate 114 and the second metal gate 116 respectively include a U shape.

Please refer to FIG. 4. After forming the first metal gate 114 and the second metal gate 116, the first metal gate 114 and the second metal gate 116 are etched by a suitable metal etch process. Consequently, a first recess 150 is formed in the first metal gate 114 and a third recess 152 is formed in the second metal gate 116, respectively. Because the first work function metal layer 106 and the second work function metal layer 108 layer include the U shape, only the protecting layer (that is the spacer 124) and the filling metal layer 109 are exposed in the first recess 150 as shown in FIG. 4. In the same concept, only the protecting layer (that is the spacer 124) and the filling metal layer 109 are exposed in the third recess 152 as shown in FIG. 4. In other words, the filling metal layer 109 is exposed in both of the first recess 150 and the third recess 152, but the first work function metal layer 106 and the second work function metal layer 108 are still covered by the filling metal layer 109.

Figure 5:
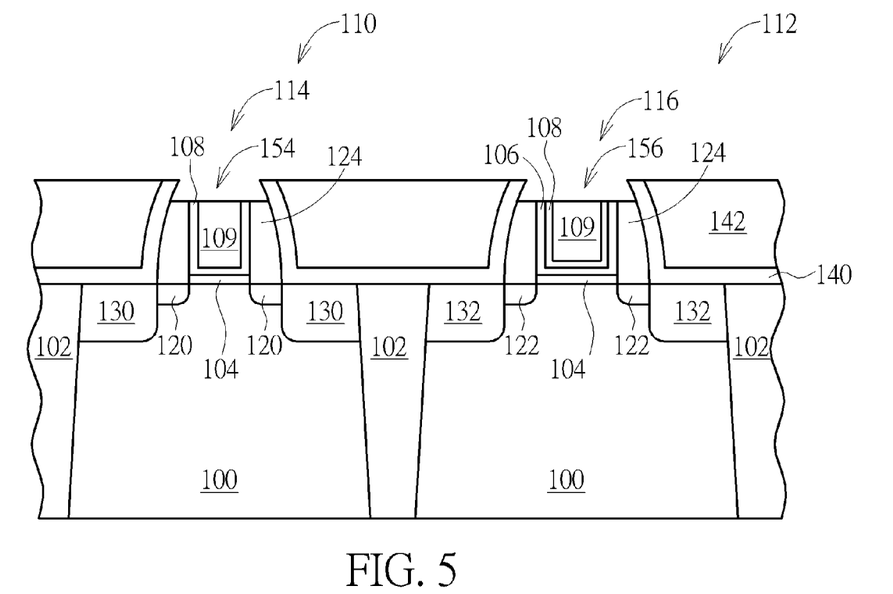
FIG. 5 is a schematic drawing in a step subsequent to FIG. 2 or FIG. 4.

Please refer to FIG. 5. It is noteworthy that steps illustrated in FIGS. 5-10 can be performed after steps disclosed in the abovementioned two preferred embodiments, therefore FIG. 5 is a schematic drawing in a step subsequent to FIG. 2 or FIG. 4. As shown in FIG. 5, an etch process different from metal etch method as mentioned above is performed after forming the first recess 150 and the third recess 152. The suitable etch process includes, for example but not limited to a dry etch or a wet etch. Accordingly, the protecting layer (that is the spacer 124) exposed at sidewalls of the first recess 150 and the second recess 152 are entirely removed to widen the first recess 150 and the third recess 152, and thus a second recess 154 and a fourth recess 156 are respectively formed. According to the preferred embodiment, the dry etch can be performed with the following gas or its combination: octafluorobutylene ($C_4F_8$), hexafluorobutadiene ($C_4F_6$), methyl fluoride ($CH_3F$), difluoromethane ($CH_2F_2$), tricholorborane ($BCl_3$), argon (Ar), oxygen (O) or nitrogen (N). According to the preferred embodiment, the wet etch can be formed with etchant such as phosphoric acid ($H_3PO_4$) or diluted hydrofluoride (DHF).

Figure 6:
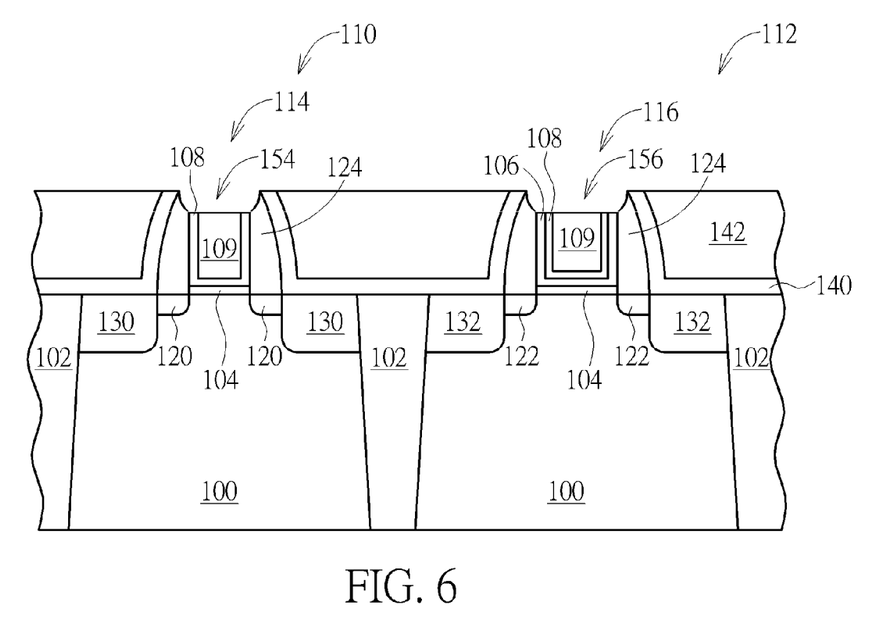
FIG. 6 is a schematic drawing illustrating a modification to the preferred embodiment.

Please refer to FIG. 6, which is a schematic drawing illustrating a modification to the preferred embodiment. According to the modification, a portion of the protecting layer (that is the spacer 124) exposing at sidewalls of the first recess 150 and the second recess 152 is partially removed by Ar plasma bombardment or SiCoNi™ etching process. Therefore, the first recess 150 and the third recess 152 are widened and thus a second recess 154 and a fourth recess 156 are respectively obtained.

Figure 7:
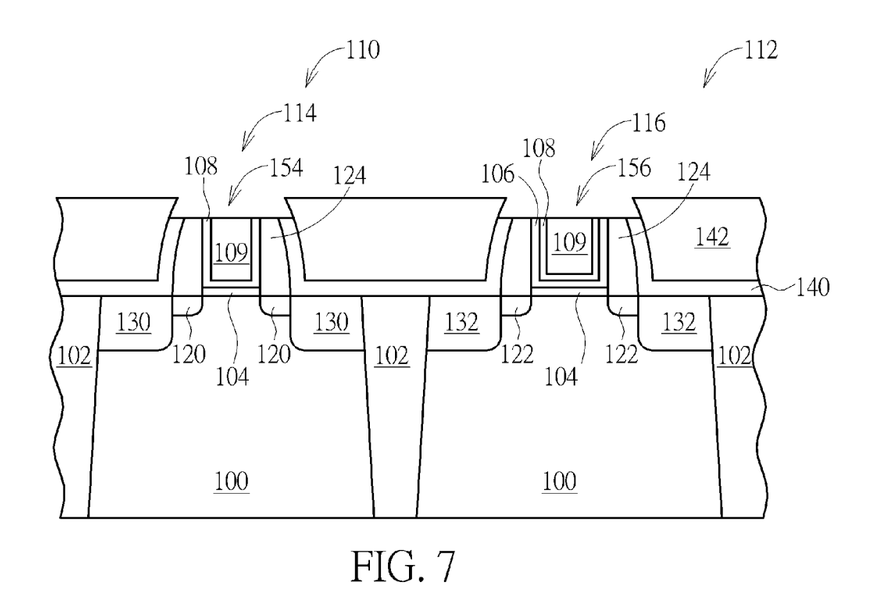
FIG. 7 is a schematic drawing illustrating another modification to the preferred embodiment.

Please refer to FIG. 7, which is a schematic drawing illustrating another modification to the preferred embodiment. It is noteworthy that because the spacer 124 and the CESL 140 are both formed at sidewalls of the first metal gate 114 and the second metal gate 116, the spacer 124 and the CESL 140 in combination can be taken as the protecting layer. According to the modification, the CESL 142 can be also removed after forming the first recess 150 and the third recess 152. Therefore the final second recess 154 and fourth recess 156 are even wider, respectively. As shown in FIG. 7, the ILD layer 142 is exposed at sidewalls of the second recess 154 and the fourth recess 156 according to the modification.

Briefly speaking, the preferred embodiment and its modification provides etching process such as wet etch, dry etch, plasma bombardment, or SiCoNi™ etching, which are different from metal etch method, to widen the first recess 150 and the third recess 152 and to form the second recess 154 and the fourth recess 156. Therefore an opening width of the second recess 154 is larger than an opening width of the first recess 150, and an opening width of the fourth recess 156 is larger than an opening width of the third recess 152. However, a depth of the second recess 154 and the fourth recess 156 are the same with a depth of the first recess 150 and the third recess 152, which is between 250 Å and 400 Å.

Figure 8:
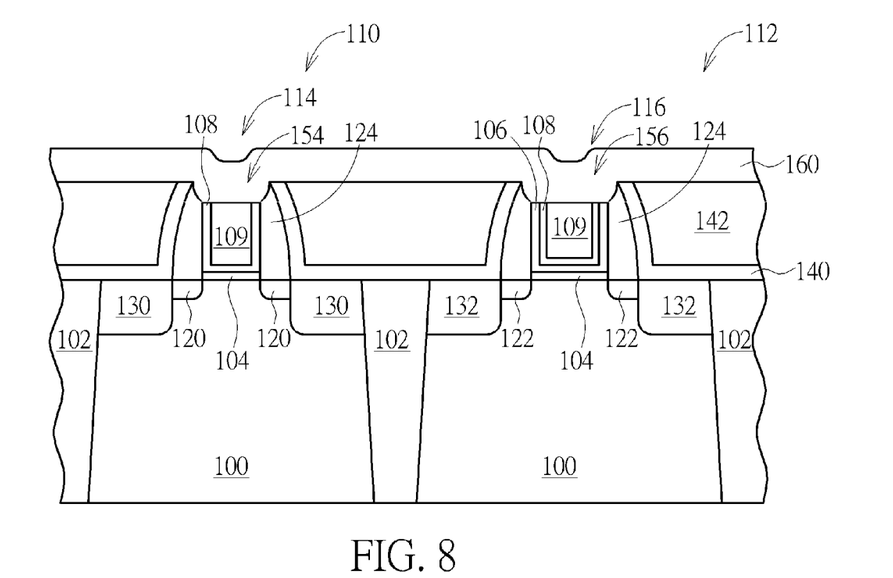
FIG. 8 is a schematic drawing in a step subsequent to FIG. 5, 6, or 7.

Please refer to FIG. 8. After forming the second recess 154 and the fourth recess 156, an etch stop layer 160 is formed on the substrate 100 by a chemical vapor deposition (CVD), and the second recess 154 and the fourth recess 156 are filled with the etch stop layer 160. The etch stop layer 160 can include silicon nitride (SiN) or silicon carbide (SiCN), but not limited to this.

Figure 9:
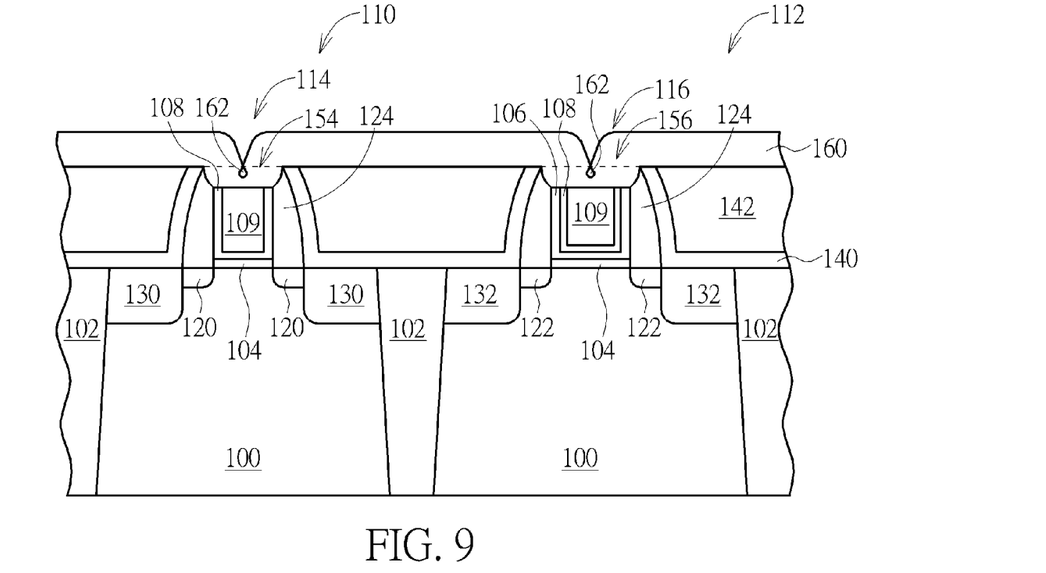
FIG. 9 is a schematic drawing illustrating still another modification to the preferred embodiment.

Please refer to FIG. 9, which is a schematic drawing illustrating still another modification to the preferred embodiment. According to the modification, a flowable chemical vapor deposition (FCVD) is performed to form the etch stop layer 160. The etch stop layer 160 can include SiN or SiCN, but not limited to this. It is noteworthy that during forming the etch stop layer 160 by the FCVD, a void 162 may be formed in the etch stop layer 160m and the void 124 is formed under the opening plane (as emphasized by the dotted line) as shown in FIG. 9.

Figure 10:
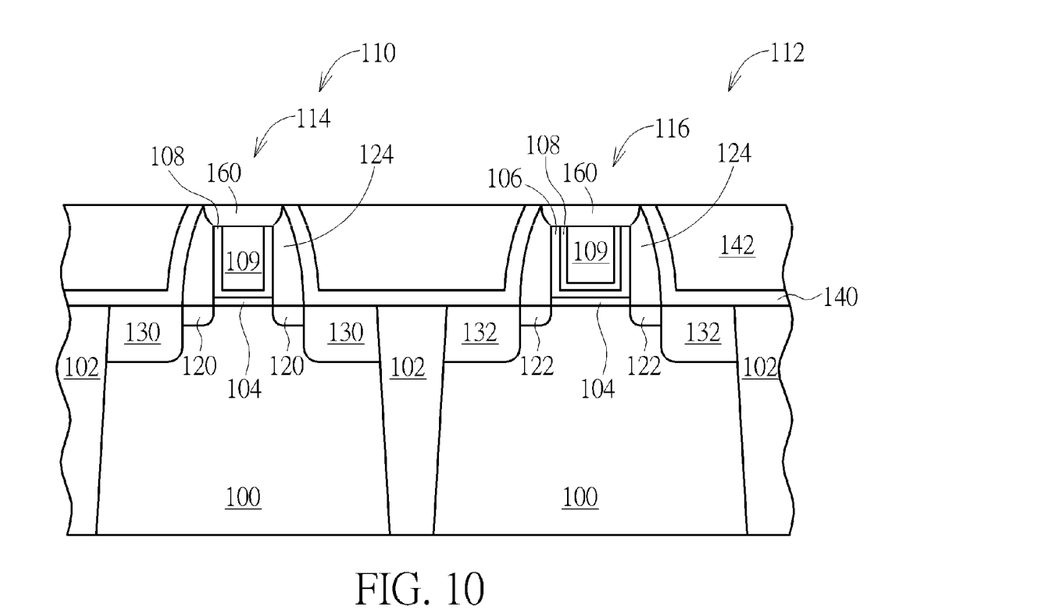
FIG. 10 is a schematic drawing in a step subsequent to FIG. 8 or FIG. 9.

Please refer to FIG. 10. After forming the etch stop layer 160, a planarization process can be selectively performed to remove superfluous etch stop layer 160. Therefore, an even surface with which a top surface of the etch stop layer 160 and a top surface of the ILD layer 142 are coplanar is obtained. As shown in FIG. 10, since the second recess 154 and the fourth recess 156 are filled up with the etch stop layer 160, a bottom of the etch stop layer 160 contacts the top of the protecting layer, that is the spacer 124 or the spacer 124 and the CESL 140 in combination. A thickness of the etch stop layer 160 is between 250 Å and 400 Å.

According to the manufacturing method for semiconductor device provided by the preferred embodiment and its modification, the recess 150/152 are formed at tops of the metal gates 114/116, and then widened. Next, the widened recesses are filled with the etch stop layer 160, therefore the width of the etch stop layer 160, which is formed on the top of the metal gate 114/116, is larger than the width of the metal gate 114/116. The wider etch stop layer 160 covers the metal gate 114/116 completely, and thus the metal gate 114/116 are protected during following process such as contact plug formation process.

Figure 11:
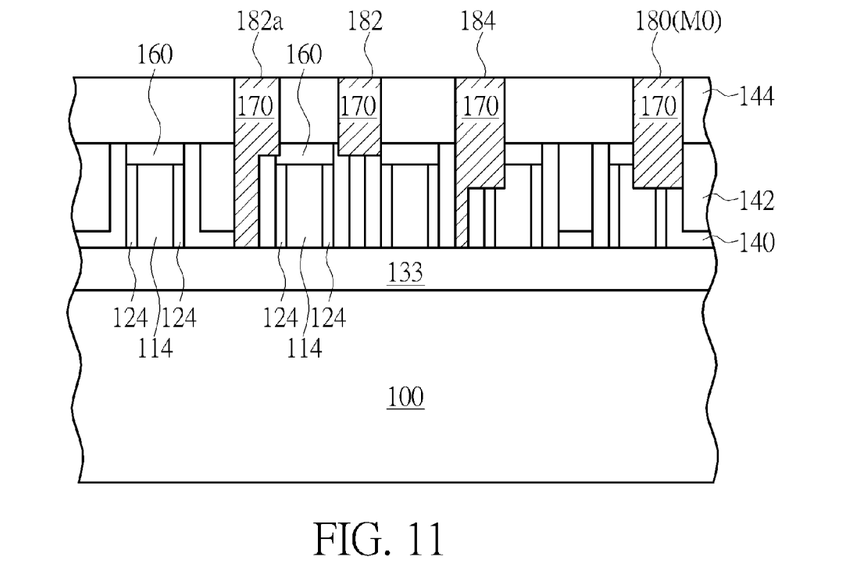
FIG. 11 is a schematic drawing illustrating a semiconductor device provided by a preferred embodiment of the present invention.

Please refer to FIG. 11, which is a schematic drawing illustrating a semiconductor device provided by a preferred embodiment of the present invention. It is noteworthy that elements the same in the instant preferred embodiment and the aforementioned preferred embodiments are designated by the same numerals. The same elements can include identical materials and conductivity types, and thus those details are omitted hereinafter in the interest of brevity. Furthermore, it should be noted that though only the first transistor 110 and its constructing elements are exemplarily discussed in the preferred embodiment, those skilled in the art would easily realize that the semiconductor device provided by the preferred embodiment can include the second transistor 112 which is complementary to the first transistor 110. Additionally, the steps for forming the first transistor 110 and the etch stop layer 160 are the same with those mentioned above, therefore the details are omitted herein for simplicity. As shown in FIG. 11, the preferred embodiment includes a substrate 100, and at least a metal gate 114 and at least a source/drain (not shown) are formed on the substrate 100. It should be noted that since the present invention can be integrated with fin field effect transistor (FinFET) technique, the source/drain can be formed in the fin structures 133 at two sides of the metal gate 114 according to the preferred embodiment. However, the source/drain still can be formed in the substrate 100 at two respective sides of the metal gate 114 as mentioned afore.

Please refer to FIG. 11 again. As mentioned above, a planarization process can be performed after forming the etch stop layer 160. Then a first dielectric layer 144 is formed on the ILD layer 142 and the etch stop layer 160. However, those skilled in the art would easily realize that the first dielectric layer 144 can be formed directly on the etch stop layer 160 without performing the planarization process. Then, a hard mask layer (not shown) and a photoresist layer (not shown) are formed on the first dielectric layer 144. The hard mask layer can be a single layer or a multiple layer. For example, the hard mask layer exemplarily includes a titanium nitride (TiN) and an oxide layer, upwardly and sequentially, but not limited to this. The photoresist layer can be a single layer or a multiple layer. For example, the photoresist layer exemplarily includes an organic dielectric layer (ODL), a silicon-containing hard mask bottom anti-reflecting coating (SHB), and a photoresist (PR) material, upwardly and sequentially, but not limited to this.

Next, the photoresist layer is patterned to define placement and size of a plurality of source/drain contact plugs. The pattern is then transferred to the hard mask layer. Next, a proper etching process is performed to etch the first dielectric layer 144 and the ILD layer 142, even the CESL 142, with the hard mask layer serving as an etching mask. Consequently, a plurality of source/drain contact holes (not shown) are formed to expose the source/drain (that is the fin structures 133 in the preferred embodiment). The photoresist layer is then removed. It is noteworthy that during forming the source/drain contact holes, the contact holes may be shifted due to misalign, and thus a shifted source/drain contact hole may be formed. More important, because the metal gate 114 is covered and protected by the etch stop layer 160, the metal gate 114 will not be exposed by the shifted source/drain contact hole. And thus the metal gate 114 always remains intact. Next, another photoresist layer (not shown) is formed. The photoresist layer can include laminations and materials the same with that photoresist layer mentioned above. The photoresist layer is then patterned to define placement and size of a plurality of metal gate contact plugs. It should be noted that in the preferred embodiment, the metal gate contact plugs are used to provide electrical connection between the metal gate 114 and the first metal structure of a multilayer interconnection structure. Therefore, the metal gate contact plugs can be taken as the $0^{th}$ metal structure (M0).

Please still refer to FIG. 11. A proper etching process is performed to etch the first dielectric layer 144 and the ILD layer 142. Consequently, a plurality of metal gate contact holes (not shown) are formed and followed by removing the photoresist layer. Next, a barrier layer (not shown) and a metal layer 170 are formed in the metal gate contact holes and the source/drain contact holes. The barrier layer can include TiN, tantalum nitride (TaN), or Ti/TiN multiple layers to improve adhesivity between the inner surface of the contact holes and the metal layer 170. The metal layer 170 can include metal layer has superior gap-filling ability such as tungsten (W), but not limited to this. Accordingly, a metal gate contact plug 180, a source/drain contact plug 182, and a common contact plug 184 are simultaneously formed in the first dielectric layer 144 and the ILD layer 142 by two individual etching steps and one metal filling step. As shown in FIG. 11, since the metal gate contact plug 180, the source/drain contact plug 182, and the common contact plug 184 are simultaneously formed, those contact plugs 180/182/184 respectively are a monolithic structure.

Please still refer to FIG. 11. As mentioned above, the contact plugs may be shifted due to misalign during the fabrication. However, since the metal gate 114 is protected by the wider etch stop layer 160 formed thereon, the metal gate 114 is prevented from being exposed by the shifted source/drain contact hole, and further prevented from being electrically connected to the shifted source/drain contact plug 182a. Consequently, short circuit between the metal gate 114 and the source/drain due to the shifted source/drain contact plug 182a is completely avoided.

Figure 12:
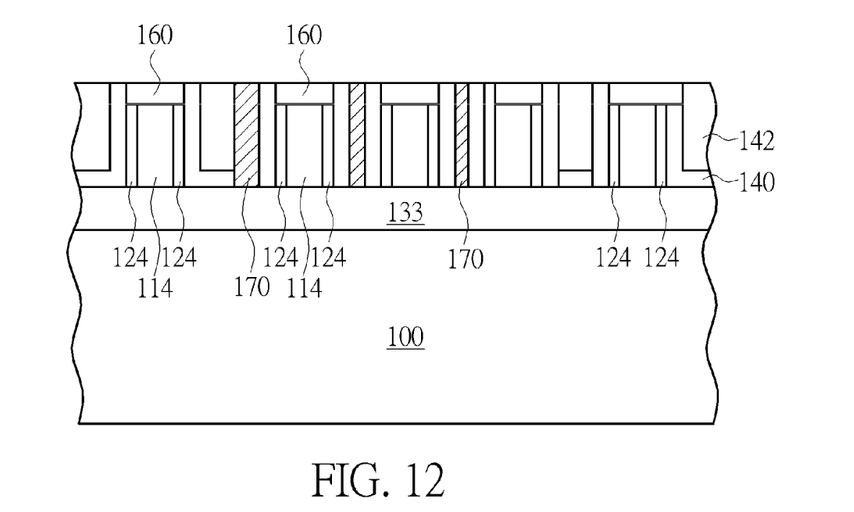
FIGS. 12-13 are schematic drawings illustrating a semiconductor device provided by another preferred embodiment of the present invention.
Figure 13:
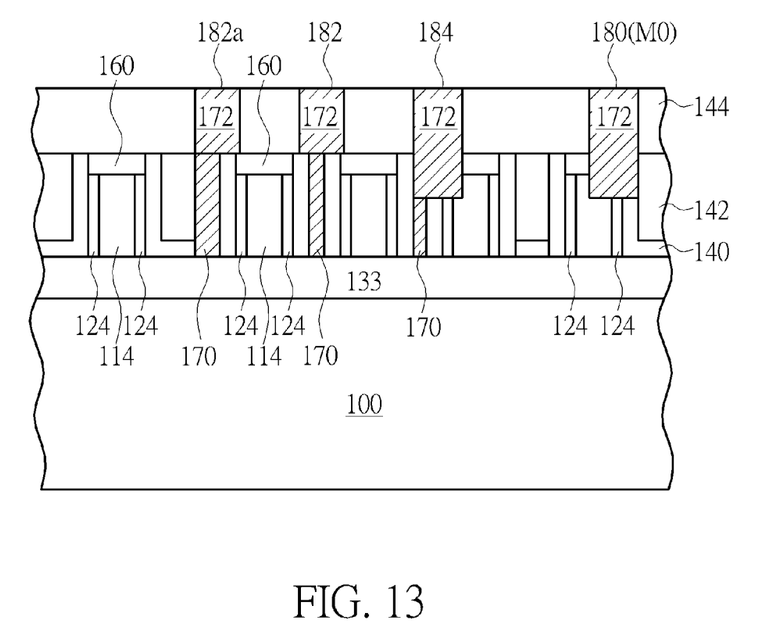

Please refer to FIGS. 12-13, which are schematic drawings illustrating a semiconductor device provided by another preferred embodiment of the present invention. It is noteworthy that elements the same in the instant preferred embodiment and the aforementioned preferred embodiments are designated by the same numerals. The same elements can include identical materials and conductivity types, and thus those details are omitted hereinafter in the interest of brevity. The difference between the instant preferred embodiment and the abovementioned preferred embodiment is: After forming ILD layer 142, source/drain contact holes (not shown) are formed in the ILD layer 142, then a barrier layer (not shown) and a metal layer 170 are sequentially formed in the source/drain contact holes. And a planarization process is performed to remove superfluous metals.

Please refer to FIG. 13. Next, a first dielectric layer 144 is formed on the ILD layer 142 and another photoresist layer (not shown) is formed on the first dielectric layer 144 and patterned for defining placement and size of a plurality of source/drain contact plugs and a plurality of metal gate contact plugs. As mentioned above, the metal gate contact plugs are used to provide electrical connection between the metal gate 114 and the first metal structure of a multilayer interconnection structure. Therefore, the metal gate contact plugs can be taken as the $0^{th}$ metal structure (M0). Thereafter, a proper etch process is performed to etch the first dielectric layer 144 and the ILD layer 142. Consequently, a plurality of source/drain contact holes (not shown) and a plurality of metal gate contact holes (not shown) are formed and followed by removing the photoresist layer. Next, a barrier layer (not shown) and a metal layer 172 are sequentially formed in the metal gate contact holes and the source/drain contact holes and followed by another planarization process for removing superfluous metals. Accordingly, a plurality of source/drain contact plugs 182, a plurality of metal gate contact plugs 180 and at least a common contact plug 184 are simultaneously formed in the first dielectric layer 144 and the ILD layer 142. As shown in FIG. 13, since the metal gate contact plugs 180, the common contact plug 184, and the source/drain contact plugs 182 are simultaneously formed by two individual etch steps and two individual metal filling steps, an interface is formed between the metal layer 170 and the metal layer 172 in some contact plugs, such as the source/drain contact plugs 182 and the common contact plug 184.

Please still refer to FIG. 13. As mentioned above, the contact plugs may be shifted due to misalign during the fabrication. However, since the metal gate 114 is protected by the wider etch stop layer 160 formed thereon, the metal gate 114 is prevented from being exposed by the shifted source/drain contact hole, and further prevented from being electrically connected to the shifted source/drain contact plug 182a. Consequently, short circuit between the metal gate 114 and the source/drain due to the shifted source/drain contact plug 182a is completely avoided.

Briefly speaking, according to the semiconductor device and the manufacturing method thereof, the etch stop layer is formed on the top of the metal gate. More important, the width of the etch stop layer is larger than the width of the metal gate. Therefore the metal gate is protected from being exposed in following process such as contact hole etch process. Consequently, short circuit between the metal gate and the source/drain caused by contact plug misalign or contact plug shift is avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate;
   a transistor formed on the substrate, the transistor comprising a metal gate;
   an etch stop layer formed on a top of the metal gate, a width of the etch stop layer being larger than a width of the metal gate; and
   an interlayer dielectric (ILD) layer surrounding the transistor, a top of the etch stop layer and a top of the ILD layer being coplanar.

2. The semiconductor device according to claim 1, further comprising a protecting layer covering sidewalls of the metal gate.

3. The semiconductor device according to claim 2, wherein the protecting layer comprises at least a spacer.

4. The semiconductor device according to claim 3, wherein the protecting layer further comprises a contact etch stop layer (CESL).

5. The semiconductor device according to claim 2, wherein a bottom of the etch stop layer contacts a top of the protecting layer.

6. The semiconductor device according to claim 1, wherein a thickness of the etch stop layer is between 250 Å and 400 Å.

7. The semiconductor device according to claim 1, further comprising at least a contact plug formed in the ILD layer.

* * * * *